United States Patent [19]

Deierling et al.

[11] Patent Number: 5,148,051
[45] Date of Patent: Sep. 15, 1992

[54] POWER UP CIRCUIT

[75] Inventors: Kevin E. Deierling; Louis Rodriguez, both of Dallas, Tex.

[73] Assignee: Dallas Semiconductor Corporation, Dallas, Tex.

[21] Appl. No.: 628,693

[22] Filed: Dec. 14, 1990

[51] Int. Cl.$^5$ .............................................. H03K 17/20
[52] U.S. Cl. ................................. 307/272.3; 307/594
[58] Field of Search ...................... 307/272.3, 592, 594, 307/597, 603, 296.5, 279

[56] References Cited

U.S. PATENT DOCUMENTS

| | | | |
|---|---|---|---|
| 3,895,239 | 7/1975 | Alaspa | 307/272.3 X |
| 4,013,902 | 3/1977 | Payne | 307/272.3 |
| 4,591,745 | 5/1986 | Shen | 307/592 |
| 4,633,107 | 12/1986 | Norsworthy | 307/594 |
| 4,670,676 | 6/1987 | Nishitani | 307/592 |
| 4,797,584 | 1/1989 | Aguti et al. | 307/272.3 X |
| 4,812,679 | 3/1989 | Mahabadi | 307/272.3 X |
| 4,818,904 | 4/1989 | Kobayashi | 307/594 |
| 4,874,965 | 10/1989 | Campardo et al. | 307/272.3 |
| 4,885,476 | 12/1989 | Mahabadi | 307/272.3 X |
| 4,886,984 | 12/1989 | Nakaoka | 307/272.3 X |
| 4,900,950 | 2/1990 | Dubajet | 307/272.3 X |
| 4,902,907 | 2/1990 | Haga et al. | 307/272.3 X |

*Primary Examiner*—David Hudspeth
*Attorney, Agent, or Firm*—Worsham, Forsythe, Sampels & Wooldridge

[57] ABSTRACT

An integrated circuit with power-up-warning circuitry wherein time integration and voltage level testing are done sequentially instead of simultaneously. A reference voltage is generated by current sourced to a reference voltage circuit, and this reference voltage is used as follows: An inverter receives the reference voltage as an input, and switches when the power supply becomes high enough that the reference voltage appears as a "low" level. When this inverter switches, current begins to be sourced to a timing capacitor. After the timing capacitor has charged up to a predetermined level, the current source to the reference-voltage node is turned off, and the power-up-warning signal (which has been driven high by output buffers) is turned off.

18 Claims, 4 Drawing Sheets

POWER UP CIRCUIT

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection t the facsimile reproduction by anyone of the patent document or patent disclosure, as it appears in the United States Patent and Trademark Office patent file or records, but otherwise reserves all copyright and maskwork rights whatsoever.

CROSS-REFERENCE TO OTHER APPLICATIONS

The following application of common assignee contains related subject matter, and is believed to have an effective filing data identical with that of the present application:

Ser. No. 628,691, filed Dec. 14, 1990, entitled "TRANSFER CIRCUIT FOR PREVENTING COLLISION ON USER READ," (DSC-187); which is hereby incorporated by reference.

BACKGROUND AND SUMMARY OF THE INVENTION

The present invention relates to low-power integrated circuits generally, and particularly to battery-backed integrated circuits.

Power-Up Warning Signal

The disclosed embodiments provide a new circuit for generating a power-up warning signal, and a new way of operating an integrated circuit (using such a power-up warning signal).

Need to Reach a Known Logic State on Power-Up

If power were suddenly applied to all parts of a complex logic circuit, the logical state of the circuit might be unpredictable. For example, a flip-flop might come up to one state on one power-up, and in a different state on the next power-up. This is undesirable for several reasons:

Self-checking operations generally require that the circuit be in a known state to start with.

It may take many cycles to force complex logic into a known state, if the starting state is unknown.

Even worse, some of the states of a complex logic circuit (unless the circuit is specifically designed to avoid this) may be "stuck" states, from which normal operation of the logic cannot recover.

A different possible problem can arise in a CMOS circuit when the supply voltage is marginally low (e.g. greater than $V_{TM}$, but less than $V_{TM}+V_{TP}$). At such marginally low voltages, some of the logic nodes will typically be floating, and the logic state of other nodes may depend on the (unpredictable) analog voltage of the floating node. As the supply voltage further increases (above $V_{TM}+V_{TP}$), some of the anomalous node values which occurred in the low-voltage regime may be "frozen in," resulting, again, in an unknown logic state.

Thus, two conditions are required before the circuit can safely enter normal operation: a certain minimum time must have elapsed; and the supply voltage must have reached a certain minimum level.

Use of the Power-Up Signal

To prevent such problems, many prior art integrated circuits will generate a "power-up" signal for a brief period when power is first turned on. This logic signal is connected to various gates around the chip, so that, when power has just been turned on, these gates will prevent the logic from commencing normal operation, and will force logic elements into a known state.[1] After a certain minimum time delay, the logic will reliably have reached a known state. At that point, the logic can be allowed to begin its normal operation, where propagation of digital logic states is allowed.

[1] Hardware features to accomplish such forcing may include, for example, reset lines connected to every logic gate on chip, or reset lines to enough nodes to ensure that, within some predetermined number of clock cycles after a reset, a known state will have been propagated to all gates. See U.S. patent application No. 238,809, filed Aug. 31, 1988 ("Nonvolatile Microprocessor with predetermined State on Power-Down," DSC-60), which is hereby incorporated by reference.

Thus, the power-up signal is used not only for resetting circuits, but also for disabling normal operation for long enough to provide a safety margin. If the power-up signal terminates too soon, the circuit may be unreliable; if the power-up signal lasts longer than it needs to, time will be wasted on every power-up; and if the power-p signal never terminates, the circuit will certainly be operative.

Generation of the Power-Up Signal

As noted, two conditions must be satisfied before the circuit can safely enter normal operation. Two circuits are normally used to test for these two conditions: an integrating capacitor, with a relatively long time constant, is used to ensure that the desired minimum time has elapsed; and a reference voltage element, driven by a load, is used to assure that the supply voltage has reached the desired minimum level. The two corresponding output signals are (effectively) ANDed to assure that the power-up transition is complete.

Figure 8:
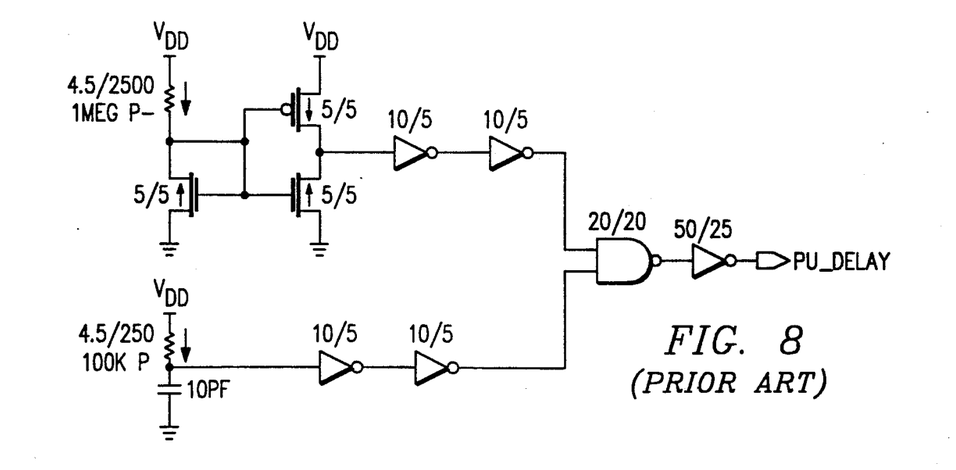

FIG. 8 shows an example of such a previously-used circuit. Note that the pull-up resistor sources current to ground whenever the power is on.

Innovative Power-Up Circuit

According to the present invention, time integration and voltage level testing are done sequentially instead of simultaneously. A reference voltage is generated by a reference voltage circuit.[2] An inverter receives the reference voltage as an input, and will switch when the power supply becomes high enough. After this inverter switches, current is then sourced to a timing capacitor. After the capacitor has charged up to a predetermined level, the current source to the reference voltage node is turned off, and the power-up warning signal (which had been driven high by output buffers) is turned off.

[2] The reference voltage generating circuit, in the presently preferred embodiment, includes an NMOS depletion load with a series resistor.

Thus, no power is consumed by this feature except during the transitional period immediately after power is applied.

Sequential Stages of Operation

In the presently preferred embodiment, several sequential stages of operation can be identified, as voltage $V_{DD}$ increases from zero:[3]

[3] It is not necessary to use all of these stages of operation, not to follow their exact sequence, in order to profit from various ones of the multiple innovative teachings set forth herein.

1. As $V_{DD}$ comes up above $V_{TP}$, a strong PMOS pull-up will begin to source current to a reference-voltage node, until the reference voltage node comes up to its regulated value ($V_{TM}$, in the presently preferred embodiment).[4]

[4] The regulated value, in the presently preferred embodiment, is provided merely by an NMOS threshold voltage. However, of course, many other techniques could be used to get this regulated value, using diodes or bipolar or MOS devices.

2. A chain of very weak inverters[5] is connected to drive an output buffer chain[6] which provides the power-up warning signal (signal "PWRUP", in the presently preferred embodiment). The chain of weak inverters provides an output which will initially be low, so that, after the output buffer chain has been powered up, signal PWRUP will go high.

[5] Note that the weak inverters also have long channels, which increases their delay.

[6] There are three progressively larger output buffers, in the presently preferred embodiment, but more or fewer could be used. However, the number of output buffers is preferably odd, since the power-up signal is preferably active-high.

3. As the power supply comes above $V_{TM}+V_{TP}$, the inverter following the reference voltage node will begin to turn on, and eventually this inverter will switch to drive its output high.[7]

[7] This logic gate begins to turn on at $V_{TM}+V_{TP}$, but will not switch until a somewhat higher voltage, because the NMOS and PMOS device sizings are asymmetrical. This point is further discussed below.

4. A weak pull-up will then begin to supply charging current to the integration capacitor.

5. After the integration capacitor has charged up to the following inverter's trip point (which is about $\frac{1}{2}V_{DD}$, in the presently preferred embodiment), two things happen:

5.1. This gate drives the chain of weak inverters which lead to the output buffer chain. Thus, after a small further delay, the power-up signal will go low.

5.2. This gate also is connected back to turn off the PMOS pull-up which is sourcing current to the reference voltage node.

Greater detail may be seen from FIGS. 1 and 2, as discussed below. (FIG. 2 is a SPICE simulation of voltages at marked nodes of FIG. 1, as the power supply $V_{DD}$ comes up.)

The present invention provides several advantages: First, there can be no current burn during the low-voltage analog period before device threshold voltages are reached. Second, since continuing current burn is not a problem, the resistor can be made of lower value. This saves space in the layout.

BRIEF DESCRIPTION OF THE DRAWING

The present invention will be described with reference to the accompanying drawings, which show important sample embodiments of the invention and which are incorporated in the specification hereof by reference, wherein:

FIGS. 4–7 illustrate data transfer operations in the serial timekeeper chip embodiment of FIG. 3.

FIG. 8 shows an example of a previously-used power-up circuit. Note that the pull-up resistor sources current to ground whenever the power is on.

DESCRIPTION OF THE PREFERRED EMBODIMENTS

The numerous innovative teachings of the present application will be described with particular reference to the presently preferred embodiment, which provides a serial timekeeping chip, which can be accessed by a user, over a serial bus, to get clock and calendar information. The disclosed innovations will therefore be described in the context of that chip. However, it must be appreciated that the disclosed innovations are not by any means limited to such a context, and this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Preferred Embodiment of the Invention

Figure 1:
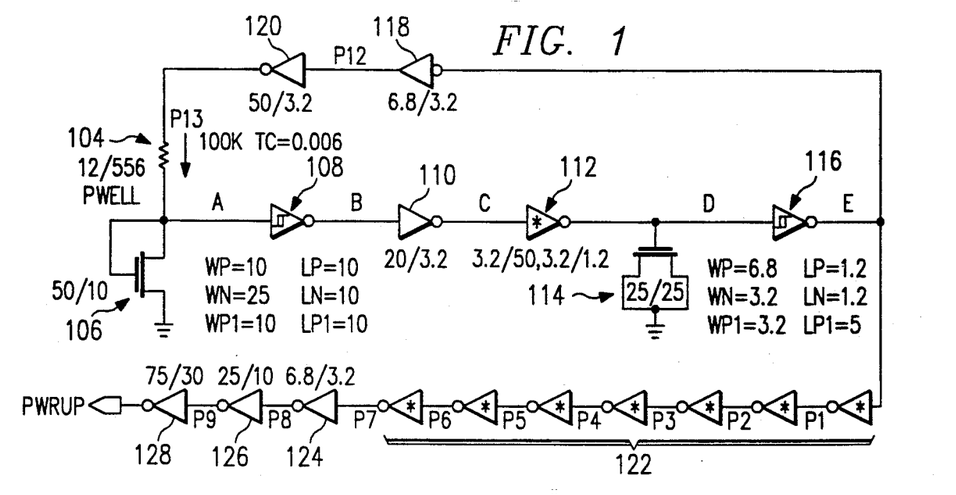
FIG. 1 shows the presently preferred embodiment of a power-up circuit according to the present invention.
Figure 2:
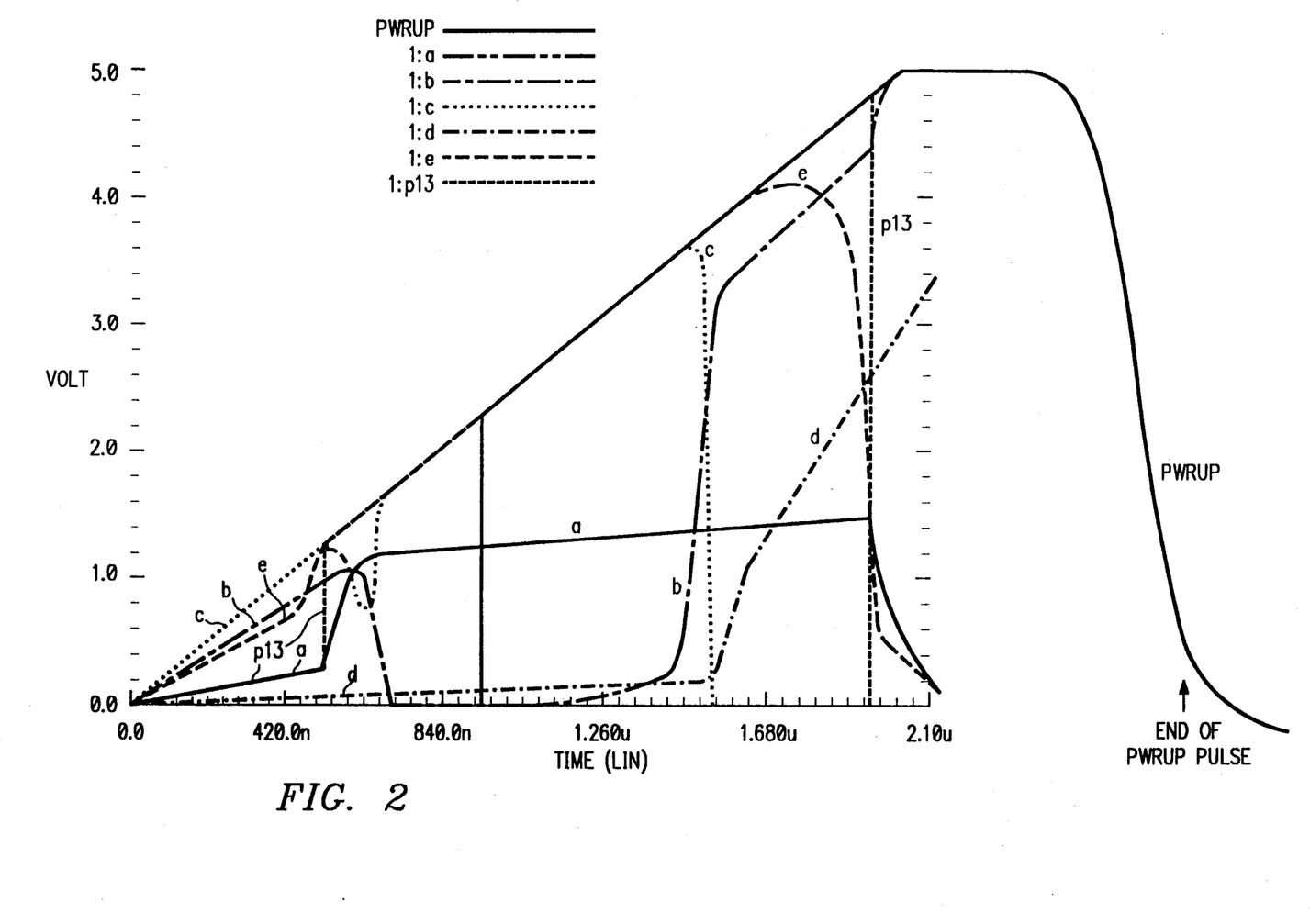
FIG. 2 shows a simulation of the voltages appearing at various nodes of the circuit of FIG. 1 as the power supply voltage increases from zero.

FIG. 1 shows the presently preferred embodiment of a power-up circuit according to the present invention, and FIG. 2 shows a simulation of the voltages appearing at various nodes of the circuit of FIG. 1 as the power supply voltage increases.

Note that inverter 120 is highly asymmetrical: its $W_P$[8] is 50 microns, but its $W_N$ is only 3.2 microns. (this helps to assure that node P13 will initially track the rising voltage $V_{DD}$.) Thus, as the power supply voltage $V_{DD}$ begins to rise, inverter 120 will begin to source current to resistor 104 and NMOS depletion load 105, thereby pulling up the voltage of node A.

[8] "$W_p$" refers to the nominal width of the PMOS device in a CMOS gate, and $W_N$ refers to the NMOS width. Similarly, $L_P$ and $L_N$ refer to the respective nominal lengths, and $V_{TP}$ and $V_{TN}$ refer to the respective threshold voltages. Logic gate parameters are commonly stated as $W_P/W_N$, in which case it is assumed that $L_P$ and $L_N$ are equal to the minimum geometry. The parameters may also be stated more fully, as $W_P/L_P$, $W_N/L_N$ (as shown for gate 112 in FIG. 1).

The presently preferred embodiment has been realized with a minimum nominal (drawn) dimension of 1.2 microns. Of course, as is well known to processing engineers, the actual dimensions may vary from the nominal dimensions, and the nominal dimensions can readily be varied according to known scaling laws.

As node A comes up to about $V_{TM}$, transistor 106 will turn on and hold the node voltage reasonably constant. (See curve "a" in FIG. 2). Transistor 106 has nominal dimensions, in the presently preferred embodiment, of $W_N=50$ μm and $L_N=10$ μm.

Node B is driven by a gate 108, which has nominal dimensions, in the presently preferred embodiment, of $W_P=10$ μm, $W_N=25$ μm, $L_P=10$ μm, and $L_N=10$ μm. This gate is a Schmitt trigger, which also includes a feedback transistor P1 having nominal dimensions of $W_{p1}=10$ μm and $L_{p1}=10$ μm.

Node C is driven by an inverter 110, which has nominal dimensions, in the presently preferred embodiment, of $W_P=20$ μm, $W_N=3.2$ μm, $L_P=1.2$ μm, and $L_N=1.2$ μm.

Node D is driven by weak gate 112, which has nominal dimensions, in the presently preferred embodiment, of $W_P=3.2$ μm, $W_N=3.2$ μm, $L_P=50$ μm, and $L_N=1.2$ μm. The current sourced to node D must charge capacitor 114 (which, in the presently preferred embodiment, is a MOs capacitor of about 525 μm², with a capacitance, at 5 Volts, of about 1 Pf). The long $L_P$ of gate 112 reduces the current sourced to capacitor 114. Thus, as shown by curve "d" in FIG. 2, this node comes up fairly slowly, even after gate 112 has turned on.

Node E is driven by a gate 116, which has nominal dimensions, in the presently preferred embodiment, of $W_P=6.8$ μm, $W_N=3.2$ μm, $L_P=1.2$ μm, and $L_N=1.2$ μm. This gate is a Schmitt trigger, which also includes a feedback transistor P1 having nominal dimensions of $W_{P1}=3.2$ μm and $L_{P1}=5$ μm.

Signal PWRUP is driven, in the presently preferred embodiment, by a chain of 10 inverters following node E. Seven weak inverters 122 (each having $W_P=7$ μm, $W_N=5.1$ μm, $L_P=40$ μm, and $L_N=40$ μm) are followed by successively larger inverters 124, 126, and 128, to produce signal PWRUP.

Node E is also followed by inverter 118, which drives inverter 120. Thus, when node E is driven low, node P13 will be driven low soon thereafter. (The low level on node E will also bring signal PWRUP low, after a delay determined by weak gates 122.) Thus, when the power-up transition is completed, current to resistor 104 is turned off, and essentially no DC current burn occurs.

In the case where $V_{DD}$ rises very slowly, the circuit shown will typically trip at a DC level of $V_{DD}=3.5$ V; but the circuit trip point may be as low as 2.1 Volts (at 100° C., where processing variation has produced strong NMOS devices and weak PMOS devices) or a high as 4.5 Volts (at −55° C., where processing variation has produced weak NMOS devices and strong PMOS devices).

Asymmetrical Device Sizes

Note that several of these gates have asymmetrical device sizes. A CMOS gate will usually be dimensioned with $W_P$ about two to three times as large as $W_N$, which will typically give a gate threshold voltage of about half the supply voltage. However, note that several of the gates shown depart markedly from this range of ratios.

Behavior of Node Voltages as $V_{DD}$ Rises

FIG. 2 shows a detailed simulation of the voltages appearing at various nodes of the circuit of FIG. 1 as the power supply voltage $V_{DD}$ increases from zero. This simulation was made using SPICE, a software package which is widely used for detailed analysis of circuit behavior.

Initially (while $V_{DD}$ is still less than $|V_{TN}|$ or $|V_{TP}|$), node A will be low, and node B will (approximately) follow $V_{DD}$ up.

When $V_{DD}$ exceeds $|V_{TP}|$, the strong P-channel device of gate 120 will turn on and pull node P13 high.

Node A will then be pulled up (with a slew rate limited by resistor 104), until it reaches $V_{TN}$. (node A is clamped at $V_{TN}$ by transistor 106.)

When node B reaches $V_{TN}$ (at approximately the same time as node A reaches $V_{TN}$), it will go to ground.

Note that node C (which initially follows $V_{DD}$ up) starts to fall as node A starts to rise; but very soon thereafter, as node B falls, node C returns to $F_{DD}$.

At about the time $V_{DD}$ reaches 2.2V (in this example), the PWRUP signal rises sharply. (The timing of this is largely determined by the delay of gates 122. Note that node E, which provides the input to gates 122, follows $V_{DD}$ up during the early stages.)

When $V_{DD}$ exceeds $V_{TN}$ plus the threshold voltage of gate 108 (about 3.5 V, in the presently preferred embodiment), gate 108 switches, and drives node B high. This drives node C low, and turns on the weak pullup transistor of gate 112. This slowly drives node D high. When node D has reached the threshold voltage of gate 116, node E goes low, and node P13 goes low. After a propagation delay (due to gates 122), signal PWRUP then goes low.

Preferred Subsystem Context for Using the Invention

The preferred integrated circuit embodiment, in which the disclosed innovative circuitry is used to provide a serial timekeeper chip, will now be described in detail. These details merely represent a contemplated example of making and using the claimed inventions, and are not all necessary for practicing the claimed inventions.

Features

Some distinctive features of the preferred serial timekeeper chip include the following:

Real Time clock counts seconds, minutes, hours, date of the month, month, day of the week and year with Leap Year compensation 24×8 RAM for scratch pad data storage Serial I/O for minimum pin count 2.5 volt clock operation Uses less than 1 μA at 3 volts Single byte or multiple byte (burst mode) data transfer for read or write of clock or RAM data 8-pin DIP or optional 16-pin SOIC for surface mount Simple 3-wire interface TTL compatible ($V_{cc}=5V$)

Pin Connections

The presently preferred best mode integrated circuit embodiment uses an 8-pin DIP package, with the following pins. An asterisk (*) represents a complemented or inverted signal.

| | |
|---|---|
| N.C. | No Connection |
| X1, X2 | 32.768 kHz Crystal Inputs |
| GND | Ground |
| RST* | Reset |
| I/O | Data Input/Output |
| SCLK | Serial Clock |
| VCC | Power Supply Pin |

General Features

The chip contains a RealTime Clock/Calendar, 24 bytes of static RAM, and communicates with a microprocessor via a simple serial interface. The RealTime Clock/Calendar provides seconds, minutes, hours, day, date, month, and year information. The end of the month data is automatically adjusted for months with less than 31 days, including corrections for leap Year. The clock operates in either the 24-hour or 12-hour format with an AM/PM indicator. Interfacing the Serial timekeeper chip with a microprocessor is simplified using synchronous serial communication. Only three wires are required to communicate with the Clock- /RAM: (1)RST* (Reset), (2) I/O (Data line), and (3) SCLK (Serial Clock). Data can be transferred to and from the Clock/RAM one byte at a time or in a burst of up to 24 bytes. The serial timekeeper chip is designed to operate on very low power and retain data and clock information on less than 3 microwatts.

Operation

Figure 3:
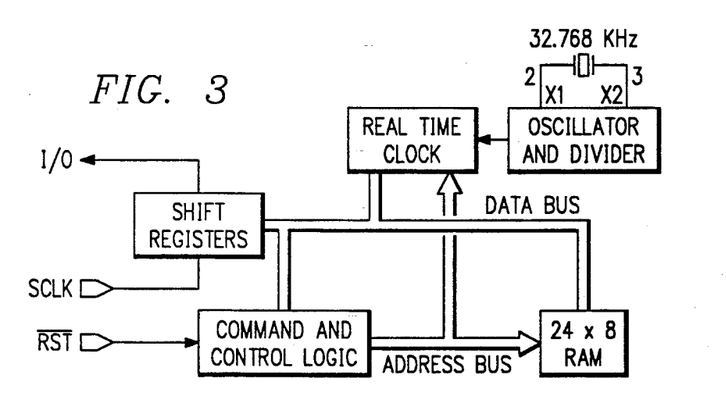
FIG. 3 shows the main elements of the serial timekeeper chip embodiment.

The main elements of the serial timekeeper chip are shown in FIG. 3, namely, shift register, control logic, oscillator, real time clock and RAM. To initiate any transfer of data, RST* is taken high and eight bits are loaded into the shift register providing both address and command information. Each bit is serially input on the rising edge of the clock input. The first eight bits specify which of 32 bytes will be accessed, whether a read or write cycle will take place, and whether a byte or burst mode transfer is to occur. After the first eight clock cycles have occurred which load the command word into the shift register, additional clocks will output data for a read, or input data for a write. The number of clock pulses equals eight plus eight for byte mode or eight plus up to 192 for burst mode.

protect command, $8E_H$, is loaded into the shift register followed by eight bits, $00_H$. RST* must be driven before any other command can be initiated. To restore write protect, drive RST* high followed by WRITE command byte, $8E_H$, and data byte $80_H$. Sixteen clock cycles are required for this operation. Complete the operation by driving RST* low.

Reset And Clock Control

Figure 4:
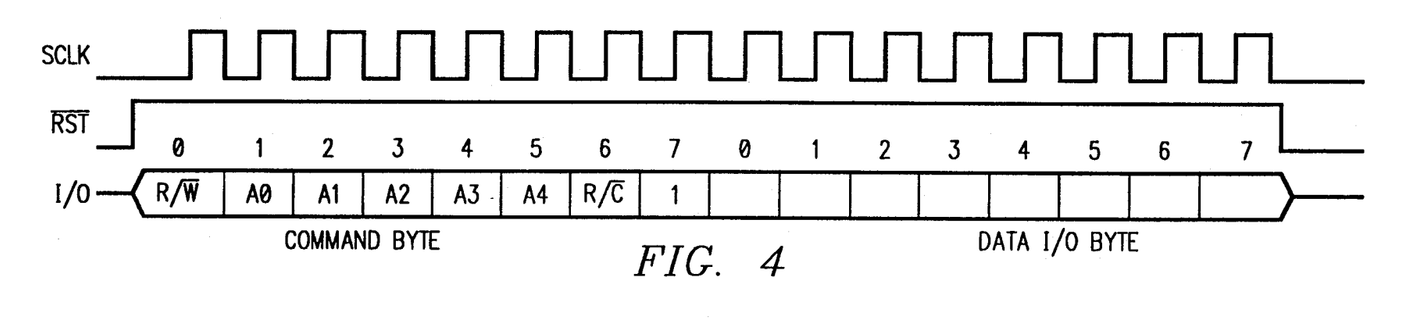
FIG. 4 shows single byte transfer.
Figure 5:
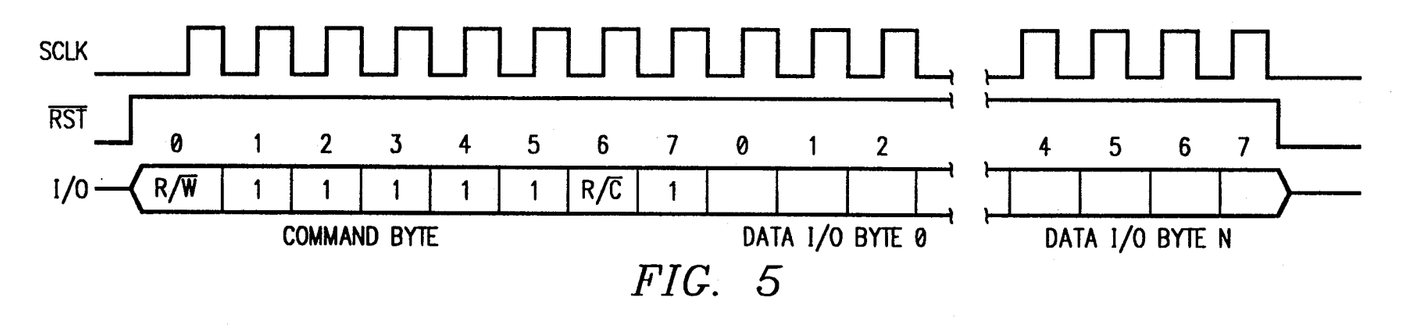
FIG. 5 shows burst mode transfer.
Figure 6:
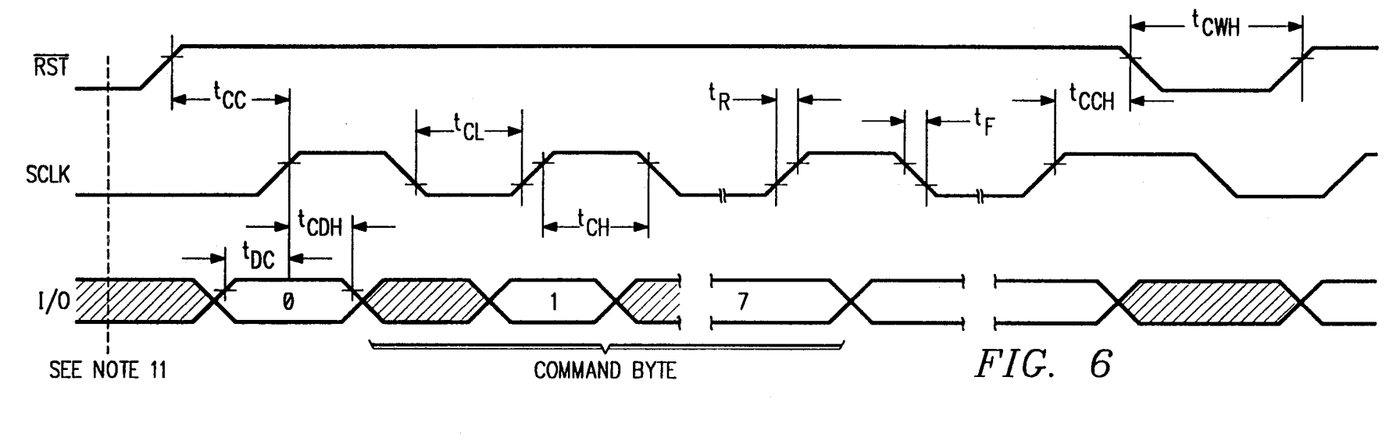
FIG. 6 shows write data transfer.

All data transfers are initiated by driving the RST* input high. The RST* input serves two functions. First, RST* turns on the control logic which allows access to the shift register for the address/command sequence. Second, the RST* signal provides a method of terminating either single byte or multiple byte data transfer. A clock cycle is a sequence of a falling edge followed by a rising edge. For data inputs, data must be valid during the rising edge of the clock and data bits are output on the falling edge of clock. All data transfer terminates if the RST input i low and the I/O pin goes to a high impedance state. Data transfer is illustrated in FIGS. 4–7; FIG. 4 shows single byte transfer; FIG. 5 shows burst mode transfer; FIG. 6 shows write data transfer;

TABLE 1

| FUNCTION | COMMAND ADDRESS (HEX) | WRITE = W READ = R | RANGE - DATA MODE BCD | REGISTER DEFINITION 7 6 5 4 3 2 1 0 | INITIAL POWER ON STATUS |
|---|---|---|---|---|---|
| SECONDS | 80 | W | 00-59 | CH \| 10 SEC \| SEC | 80 |
|  | 81 | R |  |  |  |
| MINUTES | 82 | W | 00-59 | 0 \| 10 MIN \| MIN | 00 |
|  | 83 | R |  |  |  |
| 12 HR | 84 | W | 01-12(12 HR) | 12 0 A/P HR \| HR | 00 |
| 24 HR | 85 | R | 00-23(24 HR) | 24 \| 10 |  |
| DATE | 86 | W | 01-31 | 0 0 10 DATE DATE | 01 |

Command Byte

Each data transfer is initiated by a one byte input called the address/command byte. The format of the address/command byte is shown in Table 1.

As defined, the MSB (Bit 7) must be a logical one. If zero, further action will be terminated. Bit 6 specifies a clock/calendar register if logic zero or a RAM location if Logical One. Bits one through five specify the designated registers to be input or output and the LSB (Bit 0) specifies a write operation (input) if logical zero or read operation output if logical one. To initiate any write operation, the write protect bit must be set to zero.

Burst Mode

Burst Mode may be specified for either the clock/calendar or the RAM registers by initiating a burst mode command. Bit 6 specifies clock or RAM and bit 0 specifies read or write. There is not data storage capacity in the Clock/Calendar or in the RAM for command bytes.

Write Protect Command Byte

Figure 7:
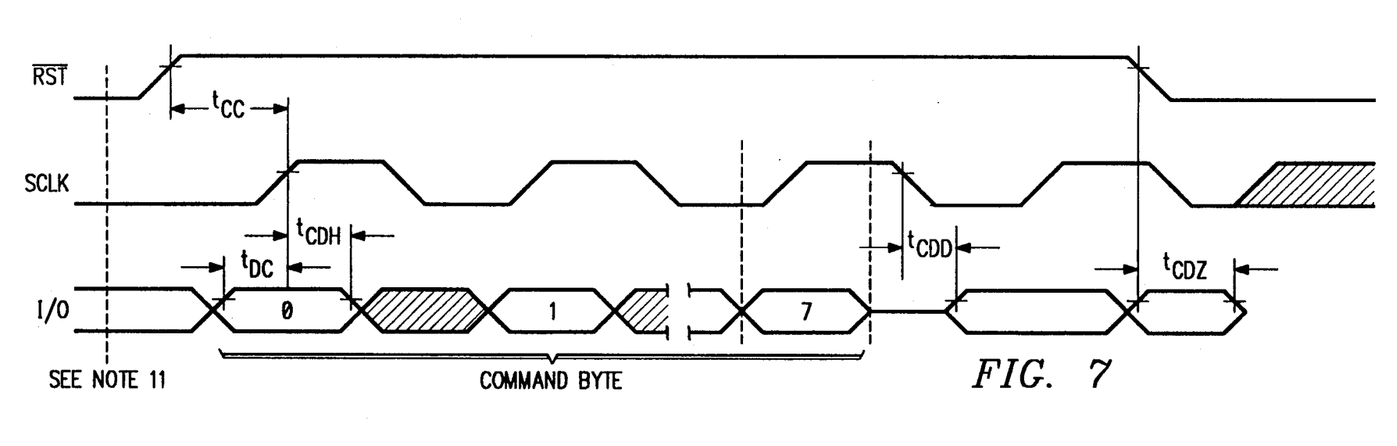
FIG. 7 shows a read data transfer.

Before any write operation to clock/calendar or RAM, the write protect bit must be set to zero. This operation requires driving the RST* high and the write and FIG. 7 shows a read data transfer.

Data Input

Following the eight SCLK cycles that input the write mode command byte a data byte is read on the rising edge of the next eight SCLK cycles. Additional SCLK cycles are ignored should they inadvertently occur.

Data Output

Following the eight SCLK cycles that input the read mode command byte a data bit is read out on the falling edge of the next eight SCLK cycles. Note that the first data bit to be transmitted from the clock/RAM occurs on the first falling edge after the last bit of the command byte is written. Additional SCLK cycles retransmit the data bytes should they inadvertently occur so long as RST remains high. This operation permits continuous burst read mode capability.

Clockcalendar

The Clock/Calendar is contained in eight writable/readable registers as shown in Table 2. Data contained in the clock/calendar registers is in binary coded decimal format (BCD).

TABLE 2

| REGISTER ADDRESS | REGISTER DEFINITION |
|---|---|

TABLE 2-continued

A. CLOCK

| Register | 7 | 6 | 5 | 4 | 3 | 2 | 1 | 0 | Range | | | | | | |
|---|---|---|---|---|---|---|---|---|---|---|---|---|---|---|---|
| SEC | 1 | 0 | 0 | 0 | 0 | 0 | 0 | RD/W | 00-59 | CH | | 10 SEC | | SEC | |
| MIN | 1 | 0 | 0 | 0 | 0 | 0 | 1 | RD/W | 00-59 | 0 | | 10 MIN | | MIN | |
| HR | 1 | 0 | 0 | 0 | 0 | 1 | 0 | RD/W | 01-12 / 00-23 | 12/24 | 0 | 10 A/P | HR | DATE | |
| DATE | 1 | 0 | 0 | 0 | 0 | 1 | 1 | RD/W | 01-28/29 01-30 01-31 | 0 | 0 | 10 DATE | | DATE | |
| MONTH | 1 | 0 | 0 | 0 | 1 | 0 | 0 | RD/W | 01-12 | 0 | 0 | 0 | 10 M | MONTH | |
| DAY | 1 | 0 | 0 | 0 | 1 | 0 | 1 | RD/W | 01-07 | 0 | 0 | 0 | 0 | 0 | DAY |
| YEAR | 1 | 0 | 0 | 0 | 1 | 1 | 0 | RD/W | 0-99 | | 10 YEAR | | | YEAR | |
| CONTROL | 1 | 0 | 0 | 0 | 1 | 1 | 1 | RD/W | | WP | | FORCED TO ZERO | | | |
| CLOCK BURST | 1 | 0 | 1 | 1 | 1 | 1 | 1 | RD/W | | | | | | | |

B. RAM

| Register | 7 | 6 | 5 | 4 | 3 | 2 | 1 | 0 | | | |
|---|---|---|---|---|---|---|---|---|---|---|---|
| RAM 0 | 1 | 1 | 0 | 0 | 0 | 0 | 0 | RD/W | RAM DATA | 0 | |
| ⋮ | | | | | | | | | | | |
| RAM 23 | 1 | 1 | 1 | 1 | 1 | 1 | 1 | RD/W | RAM DATA | 23 | |
| RAM BURST | 1 | 1 | 1 | 1 | 1 | 1 | 1 | RD/W | | | |

Clock Halt Flag

Bit 7 of the seconds register is defined as the clock halt flag. When this bit is set to logic one, the clock oscillator is stopped and the serial timekeeper chip is placed into a low power standby mode with a current drain of not more than 1.0 microamp. When this bit is written to logical zero, the clock will start.

AM-PM/12-24 Mode

Bit 7 of the hours register is defined as the 12- or 24-hour mode select bit. When high, the 12-hour mode is selected. In the 12-hour mode, bit 5 is the AM/PM bit with logic high being PM. In the 24-hour mode, bit 5 is the second 10 hour bit (20+hours).

Write Protect Register

Bit 7 of write protect register is the write protect bit. The first seven bits (bits 0-6) are forced to zero and will always read a zero when read. Bit 7 is set to logical one on power up and before any write operation to CLK or RAM, bit 7 must be set to zero. When high, the write protect bit prevents a write operation to any other register.

Clock/Calendar Burst Mode

The clock/calendar command byte specifies burst mode operation. In this mode the eight clock/calendar registers may be consecutively read or written.

RAM

The Static RAM is 24×8 bytes addressed consecutively in the RAM address space.

RAM Burst Mode

The RAM command byte specifies burst mode operation. In this mode, the 24 RAM registers may be consecutively read or written.

Register Summary

A register data format summary is shown in Table 2, above.

Crystal Selection

A 32,768 kHz crystal, Daiwa part No. DT26S, Seiko Part No. DS-VT-200 or equivalent, can be directly connected to the serial timekeeper chip via pins 2 and 3 (X1,X2). The crystal selected for use should have a specified load capacitance ($C_L$) of 6 pF.

Detailed Parameters

The following tables give specific values for some of the voltage and timing parameters just referred to, as used in the specific context of the presently preferred embodiment. It must be understood that these specific values are given merely to provide a wealth of detail regarding the described chip embodiment, and do not by any means delimit necessary features of the invention.

| ABSOLUTE MAXIMUM RATINGS: | | | | | |
|---|---|---|---|---|---|
| VOLTAGE ON ANY PIN RELATIVE TO GROUND | | | | −0.5 V TO +7.0 V | |
| OPERATING TEMPERATURE | | | | 0° C. TO +70° C. | |
| STORAGE TEMPERATURE | | | | −55° C. TO +125° C. | |
| SOLDERING TEMPERATURE | | | | 260° C. FOR 10 SEC | |
| PARAMETER | SYMBOL | MIN | TYP | MAX | UNITS | NOTES |
| RECOMMENDED D.C. OPERATING CONDITIONS (0° to ±70° C.) | | | | | | |
| Supply Voltage | $V_{CC}$ | 4.5 | 5.0 | 5.5 | VOLTS | 1 |
| Standby Supply Voltage | $V_{CC1}$ | 3.0 | | 5.5 | VOLTS | 1 |
| Logic 1 Input | $V_{IH}$ | 2.0 | | $V_{CC}$ | VOLTS | 1 |
| Logic 0 Input | $V_{IL}$ | −0.5 | | 0.8 | VOLTS | 1 |
| DC Electrical Characteristics (0° to +70° C., $V_{CC}$ = 5 V ± 10%) | | | | | | |
| Input Leakage | $I_{LI}$ | | | +500 | μA | 6 |
| I/O Leakage | $I_{LO}$ | | | +500 | μA | 6 |
| Logic 1 Output | $V_{OH}$ | 2.4 | | | VOLTS | 2 |
| Logic 0 Output | $V_{OL}$ | | | 0.4 | VOLTS | 3 |
| Active Supply Current | $I_{CC}$ | | | 4 | mA | 4 |
| Standby Supply Current | $I_{CC1}$ | | | 1 | μA | 5 |
| Standby Supply Current | $I_{CC2}$ | | | 100 | nA | 10 |
| CAPACITANCE ($T_A$ = 25° C.) | | | | | | |
| Input Capacitance | $C_I$ | | | 5 | pF | |
| I/O Capacitance | $C_{I/O}$ | | | 10 | pF | |
| Crystal Capacitance | $C_X$ | | | 6 | pF | |
| AC Electrical Characteristics ($V_{CC}$ = +5 V ± 10%, 0°-70° C.) | | | | | | |
| Data To CLK Setup | $t_{DC}$ | 50 | | | ns | 7 |
| CLK To Data Hold | $t_{CDH}$ | 70 | | | ns | 7 |
| CLK To Data Delay | $t_{CDD}$ | | | 200 | ns | 7,8,9 |
| CLK Low Time | $t_{CC}$ | 250 | | | ns | 7 |
| CLK High Time | $t_{CH}$ | 250 | | | ns | 7 |
| CLK Frequency | $f_{CLK}$ | D.C. | | 2.0 MHz | | 7 |
| CLK Rise & Fall | $t_F$ | | | 500 | ns | |
| RST To CLK Setup | $t_{CS}$ | 1 | | | us | 7 |
| CLK To RST Hold | $t_{CCH}$ | 60 | | | ns | 7 |
| RST Inactive Time | $t_{CWH}$ | 1 | | | us | 7 |
| RST To I/O High Z | $t_{CDZ}$ | | | 70 | ns | 7 |

NOTES TO THE TABLES:
1 All voltages are referenced to ground.
2 Logic one voltages are specified at a source current of 1 mA.
3 Logic zero voltages are specified at a sink current of 4 mA.
4 $I_{CC}$ is specified with the I/O pin open.
5 $I_{CC1}$ is specified with $V_{CC}$ at 3.0 volts and RST*, I/O, and SCLK are open.
6 RST*, SCLK and I/O all have 40 kΩ pull down resistors to ground.
7 Measured at VIH = 2.0 V or VIL = 0.8 V and 10 ms maximum rise and fall time.
8 Measured at VOH = 2.4 V or VOL = 0.4 V.
9 Load capacitance = 50 pF.
10 $I_{CC2}$ is specified with $V_{CC}$ at 3.0 volts and RST*, I/O, and SCLK are open. The clock halt flag must also be set to logic one.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Of course, various of the logic gates which are shown as inverters in the presently preferred embodiment could alternatively be configured as NAND gates, NOR gates, or other structures. This might be done, for example, if it is desired to be able to force the power-up signal high from an external pin, in a system where some components may be powered down while others remain active.

As will be recognized by those skilled in the art, the innovative concepts described in the preset application can be modified and varied over a tremendous range of applications, and accordingly their scope is not limited except by the allowed claims.

What is claimed is:

1. A CMOS integrated circuit, comprising:
a first pull-up device connected to source current to a first node,
a reference-voltage current path, connected to hold the potential of said first node to at most a predetermined reference voltage,
an inverting logic stage connected to receive the potential of said first node as an input thereto;
an integration capacitor, and a second pull-up device connected to source current to said integration capacitor as soon as said inverting logic stage provides a "high" output voltage;
a thresholding logic stage, configured to initially assume a first logical state at power-up, and connected to switch from said first state to a second state whenever said capacitor has been charged to a predetermined threshold level; and
an output buffer chain, comprising one or more output buffer stages, which is operatively connected to drive a power-up warning signal line high when said thresholding logic stage is in said first state, but not when said thresholding logic stage is in said second state;
said first pull-up being operatively connected to stop sourcing current when said thresholding logic stage switches to said second state.

2. The integrated circuit of claim 1, further comprising additional circuitry which is connected to be disabled whenever said power-up warning signal is high.

3. The integrated circuit of claim 1, wherein said first pull-up device comprises a relatively strong PMOS transistor.

4. The integrated circuit of claim 1, wherein said first pull-up device consists essentially of a CMOS inverter which includes an NMOS driver and a PMOS driver which is stronger than said NMOS driver.

5. The integrated circuit of claim 1, wherein said thresholding logic stage consists essentially of an inverter.

6. The integrated circuit of claim 1, wherein said thresholding logic stage consists essentially of a CMOS inverter having approximately equal NMOS and PMOS driver strengths.

7. The integrated circuit of claim 1, wherein said reference-voltage current path consists essentially of an NMOS transistor having a gate and a drain both connected to said first node.

8. The integrated circuit of claim 1, wherein said predetermined reference voltage is approximately equal to the threshold voltage of an NMOS transistor in said integrated circuit.

9. A method for generating a power-up warning signal when power is first applied to an integrated circuit, comprising the steps of:
(a) sourcing current from a power-supply voltage to a first node, said first node being clamped to a maximum voltage which is equal, at least approximately, to a predetermined reference voltage;
(b) driving a power-up warning signal high with a chain of one or more output buffer stages as soon as the power-supply voltage is high enough to power said output buffer stages;
(c) testing the voltage of said first node, to ascertain whether the power-supply voltage has come up to a level high enough that the voltage of said first node can be recognized by a following logic gate as a "low" level;
(d) turning on a weak pull-up device,
after the voltage of said first node has been recognized by said following logic gate as a "low" level,
to supply charging current to an integration capacitor;
(e) and, after said integration capacitor has charged up to a predetermined voltage level, then
propagating a logic signal to drive said power-up signal low, and
propagating a logic signal to reduce current sourcing to said first node.

10. The method of claim 9, wherein said step (a) sources current to said first node from a strong PMOS pull-up device.

11. The method of claim 9, wherein said step (a) sources current to said first node from a CMOS inverter which includes a PMOS driver which is stronger than a respective NMOS driver thereof.

12. The method of claim 9, wherein said step (a) sources current to said first node through a resistive load.

13. The method of claim 9, wherein said chain of output buffer stages consists of an odd number of inverters.

14. The method of claim 9, wherein said chain of output buffer stages consists of an odd number of inverters, and is driven by a chain of very weak inverters.

15. The method of claim 9, wherein said chain of output buffer stages consists of an odd number of inverters, and is driven by a chain of inverters each having greater width than length in both PMOS and NMOS devices thereof.

16. The method of claim 9, wherein said chain of output buffer stages consists of an odd number of inverters, and is driven by a chain of inverters each having an NMOS driver which is stronger than a respective PMOS driver thereof.

17. The method of claim 9, wherein the voltage of said first node is regulated to be approximately one $V_{TN}$ above ground.

18. A power-on integrated circuit detector, comprising:
(a) a first pull-up device connecting a clamped node to a power supply;
(b) a switch powered by said power supply, said switch changing from a first state to a second state when the potential difference between said power supply and said clamped node becomes larger that a first threshold potential;
(c) a resistive pull-up device with connected between said power supply and a delay capacitor, said pullup device turned on when said switch is in said second state;

(d) an output switch powered by said power supply, said output switch changing from a third state to a fourth state when the potential on said capacitor becomes larger than a second threshold potential, whereby the time delay from said first switch changing state to said output switch changing state depends upon the capacitance of said capacitor and the resistance of said resistive pull-up device; and (e) a feedback from said output switch to said first pull-up device with said first pull-up device turned off when said output switch is in said fourth state, whereby to potential of said clamped node drops below the clamp level and prevents power consumption.

* * * * *